United States Patent
Yamazaki et al.

(10) Patent No.: US 6,316,789 B1
(45) Date of Patent: Nov. 13, 2001

(54) SEMICONDUCTOR DEVICE AND METHOD FOR PRODUCING THE SAME

(75) Inventors: Shunpei Yamazaki, Tokyo; Hisashi Ohtani, Kanagawa; Akiharu Miyanaga, Kanagawa; Satoshi Teramoto, Kanagawa, all of (JP)

(73) Assignee: Semiconductor Energy Laboratory Co. Ltd. (JP)

( * ) Notice: Subject to any disclaimer, the term of this patent is extended or adjusted under 35 U.S.C. 154(b) by 0 days.

(21) Appl. No.: 09/252,911

(22) Filed: Feb. 19, 1999

Related U.S. Application Data

(62) Division of application No. 08/536,973, filed on Sep. 29, 1995.

(30) Foreign Application Priority Data

Sep. 30, 1994 (JP) .................................................. 6-261171

(51) Int. Cl.⁷ .................................................. H01L 29/76
(52) U.S. Cl. ................ 257/66; 257/64; 257/65; 257/67; 257/69; 257/70
(58) Field of Search ............... 257/61–67, 359, 257/70, 69; 438/149, 166, 486

(56) References Cited

U.S. PATENT DOCUMENTS

| Re. 28,385 | 4/1975 | Mayer ..................................... 437/13 |
| Re. 28,386 | 4/1975 | Heiman et al. ......................... 437/13 |

(List continued on next page.)

FOREIGN PATENT DOCUMENTS

| 085406 | 8/1983 | (EP) . |
| 58-33822 | 2/1983 | (JP) . |
| 58-190020 | 11/1983 | (JP) . |
| 59-083993 | 5/1984 | (JP) . |
| 62-33417 | 2/1987 | (JP) . |
| 2-140915 | 5/1990 | (JP) . |
| 05-58789 | 3/1993 | (JP) . |
| 5-109737 | 4/1993 | (JP) . |
| 05-335335 | 12/1993 | (JP) . |
| 6-232059 | 8/1994 | (JP) . |

OTHER PUBLICATIONS

Fan et al., "Lateralepitaxy by Seeded Solidification for Growth of Single–Crystal SI Films on Insulators," Applied Physics Letters, vol. 38, No. 5, Mar. 1, 1981, pp. 365–367.

S. Wolf, "Silicon Processing for the VLSI Era," vol. II, pp. 114–146, Jun. 1990.

(List continued on next page.)

Primary Examiner—Eddie Lee
Assistant Examiner—Eugene Lee
(74) Attorney, Agent, or Firm—Nixon Peabody LLP; Jeffrey L. Costellia

(57) ABSTRACT

The solution (for example, a nickel acetate solution) containing a metal element such as nickel which accelerates the crystallization of silicon is applied to an amorphous silicon film by spin coating using a mask, to retain nickel in contact with the surface of the amorphous silicon film. Then, heating treatment is performed to crystallize selectively the amorphous silicon film, so that an amorphous region and a crystalline region are formed in the silicon film. In this state, the silicon film is heated to diffuse the metal element from the crystalline region to the amorphous region, thereby decreasing a concentration of the metal element in the crystalline region.

35 Claims, 6 Drawing Sheets

U.S. PATENT DOCUMENTS

| | | | | |
|---|---|---|---|---|
| 3,783,049 | | 1/1974 | Sandera | 437/142 |
| 4,007,297 | | 2/1977 | Robinson et al. | 427/93 |
| 4,231,809 | | 11/1980 | Schmidt | 437/13 |
| 4,561,171 | | 12/1985 | Schlosser . | |
| 5,010,037 | | 4/1991 | Lin et al. | 117/930 |
| 5,037,774 | | 8/1991 | Yamazaki et al. | 117/930 |
| 5,075,259 | | 12/1991 | Moran | 437/230 |
| 5,147,826 | * | 9/1992 | Liu et al. | 437/233 |
| 5,225,355 | | 7/1993 | Sugino et al. | 437/13 |
| 5,244,819 | | 9/1993 | Yue | 438/402 |
| 5,264,383 | | 11/1993 | Young | 437/40 TFT |
| 5,275,851 | * | 1/1994 | Fonash et al. | 427/578 |
| 5,298,075 | | 3/1994 | Lagendijk et al. | 134/2 |
| 5,300,187 | | 4/1994 | Lesk et al. | 437/13 |
| 5,352,291 | | 10/1994 | Zhang et al. | 117/8 |
| 5,403,772 | | 4/1995 | Zhang et al. . | |
| 5,422,311 | | 6/1995 | Woo | 437/967 |
| 5,426,061 | | 6/1995 | Sopori . | |
| 5,426,064 | | 6/1995 | Zhang et al. . | |
| 5,481,121 | | 1/1996 | Zhang et al. . | |
| 5,488,000 | * | 1/1996 | Zhang et al. | 437/21 |
| 5,492,843 | | 2/1996 | Adachi et al. . | |
| 5,501,989 | * | 3/1996 | Takayama et al. | 437/21 |
| 5,508,216 | * | 4/1996 | Inoue | 437/40 |
| 5,508,533 | | 4/1996 | Takemura . | |
| 5,529,937 | * | 6/1996 | Zhang et al. | 437/10 |
| 5,534,716 | | 7/1996 | Takemura . | |
| 5,543,352 | | 8/1996 | Ohtani et al. . | |
| 5,550,070 | | 8/1996 | Funai | 437/41 |
| 5,563,426 | | 10/1996 | Zhang et al. . | |
| 5,569,610 | | 10/1996 | Zhang et al. . | |
| 5,569,936 | | 10/1996 | Zhang et al. . | |
| 5,576,229 | * | 11/1996 | Murata et al. | 437/40 |
| 5,580,792 | | 12/1996 | Zhang et al. . | |
| 5,585,291 | | 12/1996 | Ohtani et al. . | |
| 5,589,694 | * | 12/1996 | Takayama et al. | 257/67 |
| 5,595,923 | | 1/1997 | Zhang et al. . | |
| 5,595,944 | | 1/1997 | Zhang et al. . | |
| 5,604,360 | | 2/1997 | Zhang et al. . | |
| 5,605,846 | | 2/1997 | Ohtani et al. . | |
| 5,606,179 | | 2/1997 | Yamazaki et al. . | |
| 5,608,232 | | 3/1997 | Yamazaki et al. . | |
| 5,612,250 | | 3/1997 | Ohtani et al. . | |
| 5,614,426 | | 3/1997 | Funada et al. . | |
| 5,614,733 | | 3/1997 | Zhang et al. . | |
| 5,616,506 | | 4/1997 | Takemura . | |
| 5,620,910 | | 4/1997 | Teramoto . | |
| 5,621,224 | | 4/1997 | Yamazaki et al. . | |
| 5,624,851 | | 4/1997 | Takayama et al. . | |
| 5,637,515 | | 6/1997 | Takemura . | |
| 5,639,698 | | 6/1997 | Yamazaki et al. . | |
| 5,643,826 | | 7/1997 | Ohtani et al. . | |
| 5,646,424 | | 7/1997 | Zhang et al. . | |
| 5,654,203 | | 8/1997 | Ohtani et al. . | |
| 5,656,825 | | 8/1997 | Kusumoto et al. . | |
| 5,663,077 | | 9/1997 | Adachi et al. . | |
| 5,677,549 | | 10/1997 | Takayama et al. . | |
| 5,693,003 | | 12/1997 | Makita et al. | 437/21 |
| 5,696,386 | | 12/1997 | Yamazaki . | |
| 5,696,388 | | 12/1997 | Funada et al. . | |
| 5,700,333 | | 12/1997 | Yamazaki et al. . | |
| 5,705,829 | | 1/1998 | Miyanaga et al. . | |
| 5,712,191 | | 1/1998 | Nakajima et al. . | |
| 5,744,822 | * | 4/1998 | Takayama et al. | 257/66 |
| 5,756,364 | | 5/1998 | Tanaka et al. . | |

OTHER PUBLICATIONS

S.W. Lee, et al., "PD Induced Lateral Crystallization of a SI . . . " Applied Physics Letters, vol. 66, No. 13, Mar. 1995, p. 1672.

S. Caune et al., "Combined CW Laser and Furnace Annealing of a SI . . . In Contact With Some Metals," Appl. Surf. Sci., vol. 36, 1989, p. 597.

J.M. Green et al., "Method to Purify Semiconductor Wafers," IMB Tech. Discl. Bulletin, vol. 16, No. 5, Oct. 1973, p. 1612.

S.W. Lee et al., ". . . TFT . . . By NI Induced Lateral Crystallization of a SI . . . " AM–LCD '95 Proceedings, Aug. 1995, p. 113.

S.F. Gong et al., ". . . Solid State Si–Metal Interactions . . . ", J. Appl. Phys., vol. 68, No. 9, Nov. 1990, p. 4542.

Kawazu et al., "Low–Temperature Crystallization of hydrogenated Amorphous Silicon Induced by Nickel Silicide Formation", Jap. Journal of Applied Physics, vol. 29, No. 12, Dec. 1990, pp. 2698–2704.

Fortuna et al., "In Situ Study of Ion Beam Induced Si Crystallization from a Silicide Interface", Applied Surface Science 73, (1993), pp. 264–267.

Carter et al., Ion Implantation of Semiconductors, John Wiley & Sons, New York, (1976), pp. 172–173.

P.H. Robinson et al., "Use of HCI Gettering in Silicon Device Processing," J. Electrochem. Soc., vol. 118, No. 1, Jan. 1971, pp. 141–143.

C. Hayzelden et al., "In Situ Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt 13*, 630090 Novosibirsk 90, USSR, pp. 635–640.

T. Hempel et al., "Needle–Like Crystallization of Ni Doped Amorphous Silicon Thin Films", *Solid State Communications*, vol. 85, No. 11, pp. 921–924, 1993.

R. Kakkad et al., "Crystallized Si films by Low–temperature rapid thermal annealing of amorphous silicon," J. Appl. Phys., 65(5), Mar. 1, 1989, pp. 2069–2072.

G. Liu et al., "Polycrystalline silicon thin film transistors on Corning 7059 glass substrates using short time, low–temperature processing," Appl. Phys. Lett. 62(20), May 17, 1993, pp. 2554–2556.

G. Liu et al., "Selective area crystallization of amorphous silicon films by low–temperature rapid thermal annealing," Appl. Phys. Lett. 55(7), Aug. 14, 1989, pp. 660–662.

R. Kakkad et al., "Low Temperature Selective Crystallization of Amorphous Silicon," Journal of Non–Crystalline Solids, 115, 1989, pp. 66–68.

T.J. Konno, et al., "Metal contact induced crystallization of semiconductors," Mat. Sci. & Engr'g. A, vol. A179–A180 pp. 426–432, (May, 1994) (Abstract only).

* cited by examiner

HEATING TREATMENT

HEATING TREATMENT

LASER LIGHT IRRADIATION

SEMICONDUCTOR DEVICE AND METHOD FOR PRODUCING THE SAME

This application is a divisional application of Ser. No. 08/536,973, filed Sep. 29. 1995.

BACKGROUND OF THE INVENTION

1. Field of the Invention

The present invention relates to a thin film transistor and a method for producing the same.

2. Description of the Related Art

Recently, much attention is paid on a liquid crystal device with a constitution comprising thin film transistors (TFTs). In a device of this type denoted as an active matrix type liquid crystal display device, a TFT is formed in each of several million pixels or more arranged in matrix and the charge stored in each pixel is controlled by the TFT. Since a liquid crystal display device of the active matrix type enables a fine display at a high speed, it is utilized in a display device of a hand-held word processor or a computer.

Generally, at present, in an active matrix type liquid crystal display device, the TFTs provided in each pixel is produced using an amorphous silicon film formed by plasma CVD, and a peripheral driver circuit for driving the TFTs provided to each pixel is constructed by an external IC. The peripheral driver circuit is constructed by an external IC because the operation speed of a TFT using amorphous silicon film is too slow to satisfactorily operate as a peripheral driver circuit. In addition, although the peripheral driver circuit is generally constructed by a CMOS circuit, there is a problem that a CMOS circuit cannot be fabricated, because the properties of a P-channel TFT based on an amorphous silicon film are too inferior as compared with those of an N-channel TFT.

A TFT based on an amorphous silicon film is utilized in a liquid crystal display device of an active matrix type because the heat resistance must be considered in case a glass substrate is used. In general, a liquid crystal display device requires a transparent substrate. Thus, a type of material of the substrate is limited. Generally, an inexpensive transparent material available as a large-area substrate is confined to glass. However, since distinct shrinking and warping appear on a glass substrate when it is heated at 600° C. or higher, a glass substrate can not be used practically in a process having heating treatment at 600° C. or higher. For example, the deformation (strain) temperature of a Corning 7059 glass substrate that is commonly used as a substrate for a liquid crystal display device of an active matrix type is 593° C. Thus, if heating treatment at a temperature higher than the deformation temperature is performed for the Corning 7059 glass substrate, a large warping or shrinking occurs on the substrate to make it practically unapplicable.

On the other hand, an amorphous silicon film can be formed easily over a large area at a low temperature (400° C. or lower) by plasma CVD.

As described above, in a conventional technique, when a glass substrate is used, a semiconductor portion of a TFT to be produced may be constructed by an amorphous silicon film.

An active matrix type liquid crystal display device using quartz substrate is also known. Since a device of this type allows a heating treatment at 800° C. or higher, or 900° C. or higher, a TFT using a crystalline silicon thin film can be produced. Since a TFT based on a crystalline silicon film can be operated at a speed far higher than that of a TFT based on an amorphous silicon film, a finer display can be realized at a higher speed. Also, by using a crystalline silicon film for the TFT, a peripheral driver circuit can be arranged on the same substrate (a quartz substrate) to realize a compact and light-weight liquid crystal display device.

However, a quartz substrate is very expensive, and it costs 10 times as high as the price of a glass substrate. Thus, a quartz substrate is economically unfeasible.

SUMMARY OF THE INVENTION

An object of the present invention is to solve the above problems, and to provide a TFT having a crystalline silicon film which can be formed on a glass substrate. That is, an object of the present invention is to provide a technology for forming a crystalline silicon film on a glass substrate at 600° C. or lower, and thereby to produce a TFT using the resulting crystalline silicon film. Another object of the present invention is to provide a technology for producing a TFT which operates stably.

According to the present invention, there is provided a method for producing a TFT, which includes the steps of, forming a silicon film having an amorphous region and a crystalline region on a substrate having an insulating surface, and performing heating treatment, wherein the crystalline region contains a metal element which accelerates (promotes) the crystallization of silicon and the heating treatment allows the metal element to diffuse from the crystalline region into the amorphous region.

Also, according to the present invention, there is provided a method for producing a TFT, which includes the steps of, forming a silicon film having a crystalline region on a substrate having an insulating surface, and performing heating treatment, wherein the crystalline region includes a metal element for promoting crystallization of silicon and the metal element is diffused from the crystalline region to a region other than the crystalline region by the heating treatment.

In the above constitution, as a substrate having an insulating surface, there are a glass substrate, a quartz substrate, a glass substrate or a quartz substrate having an insulating film formed thereon, etc. The present invention is particularly useful in case a glass substrate is used as the substrate.

In forming a silicon film having an amorphous region and a crystalline region, more specifically, a metal element which accelerates the crystallization of silicon is selectively introduced into the amorphous silicon film, and a heating treatment at about 450 to 600° C. is performed. In this treatment, the region into which the metal element is introduced and a region in the periphery of the metal-introduced region can be selectively crystallized. The upper limit of the heating temperature depends on the heat resistance temperature, i.e., the deformation (strain) temperature, of the glass substrate. For example, by considering the heat resistance of the glass substrate and from the viewpoint of productivity, the heating temperature is preferably about 550° C. In case a quartz substrate or any heat-resistant material which resists to a heating treatment at 1,000° C. or higher, the heating temperature can be elevated in accordance with the heat resistance of the substrate material.

At least one selected from the group of Fe, Co, Ni, Ru, Rh, Pd, Os, Ir, Pt, Cu, and Au can be used as the metal elements for accelerating the crystallization of silicon. Particularly effective among the metal elements above is nickel (Ni). The metal element can be introduced into the amorphous silicon film by forming a thin film of the metal element on the surface of the amorphous silicon film using a physical method such as sputtering, CVD, or evaporation, or by applying the amorphous silicon film to a solution containing the metal element. In the physical method, it is difficult to uniformly form an extremely thinner film on the amorphous silicon film. Thus, since the metal element can not be brought in uniform contact with the amorphous silicon film, its distribution becomes unbalanced easily during the crystal growth. On the other hand, the concentration of the metal element can be readily controlled by the method of using a solution. Further, the method using a solution maintains the metal element in uniform contact with the surface of the amorphous silicon film. Thus, the method using a solution is preferred as compared with the method for physically forming a metal film.

The metal element must be introduced into the amorphous silicon film at a concentration of $1 \times 10^{16}$ m$^{-3}$ or more at the crystallization by heating. However, it is not preferred to introduce the metal element into the amorphous silicon film at a concentration of $5 \times 10^{16}$ cm$^{-3}$ or higher, because a silicide forms inside the film.

As described above, by heating treatment to diffuse the metal element into the amorphous region from the crystalline region (or to absorb the metal element into the amorphous region), the concentration of the metal element in the crystalline region can be controlled to $1 \times 10^{16}$ cm$^{-3}$ or lower.

The heating treatment for diffusing the metal element can be effected at 400° C. or higher, although the upper limit of the heating treatment depends on the heat resistance of the substrate; thus, in a glass substrate, the upper limit depends on the deformation temperature. The heating treatment can be effected in two ways: one is heating at a temperature at which the amorphous region is not crystallized (generally, at 450° C. or lower), and the other is heating at a temperature at which the amorphous region is crystallized (generally, at 450° C. or higher, and preferably, at 500° C. or higher).

By heating treatment without crystallizing the amorphous region, the effect of diffusing the metal element from the crystalline region into the amorphous region or that of absorbing the metal element with the amorphous region from the crystalline region can be realized. By the heating treatment over a long time, the concentration of the metal element in the crystalline region can be lower than that of the metal element in the amorphous region into which the metal element has diffused. This is because dangling bonds remain in a large quantity in the amorphous region. That is, silicon atoms remain in the amorphous silicon film in a state more prone to form a bond with metal elements. This effect becomes more distinct in case the density of defects is artificially increased in the amorphous silicon film. The phenomenon can be regarded as an absorbing effect of the amorphous region on a metal element. The heating treatment in this case is case may be performed at 400 to 450° C. for about 5 minutes to 10 hours.

When heating treatment is performed at a temperature at which the crystallization of the amorphous region proceeds, the diffusion of the metal element apparently ceases at the state the amorphous silicon film is crystallized, and the metal elements concentrate at the front end of crystal growth portion. In the present invention, heating treatment is performed in such a manner that the front end of crystal growth portion may move beyond the region necessary as an intrinsic semiconductor to leave no portions of concentrated metal elements inside the region of intrinsic semiconductor.

According to the present invention, there is provided a semiconductor device which comprises, an active layer having at least a source region, a drain region, and a channel forming region; a gate insulating film formed on the active layer; and a gate electrode formed on the gate insulating film, wherein the active layer contains a metal element which accelerates the crystallization of silicon and the average concentration of the metal element in the channel forming region is about the same or lower than that in the source and drain regions.

The constitution can be obtained by forming a crystalline silicon region by the metal element as at least the channel forming region in the active layer, while forming an amorphous region in the periphery of the crystalline region, for instance, the source/drain region or a part thereof, and then performing heating treatment to the resulting structure to absorb the metal element (allow the metal element to diffuse) from the crystalline region into the amorphous region.

By the above constitution, the concentration of the metal element in the channel forming region can be controlled to $1 \times 10^{18}$ cm$^{-3}$ or lower while simultaneously adjusting the concentration of the metal element in the source and drain regions in $1 \times 10^{18}$ to $5 \times 10^{19}$ cm$^{-3}$. The concentration of the impurity in the specification is defined by the minimum concentration detected SIMS (secondary ion mass spectroscopy).

DETAILED DESCRIPTION OF THE PREFERRED EMBODIMENTS

Example 1

Figure 2A:
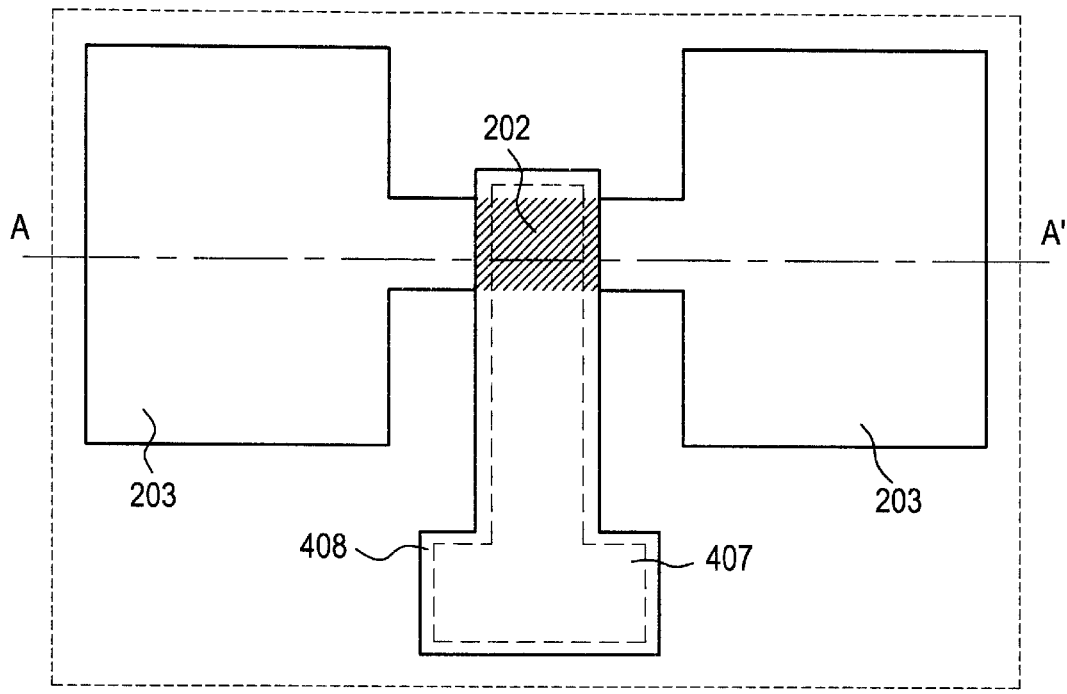
FIGS. 2A and 2B are another planar views of a structure obtained in producing a TFT.
Figure 2B:
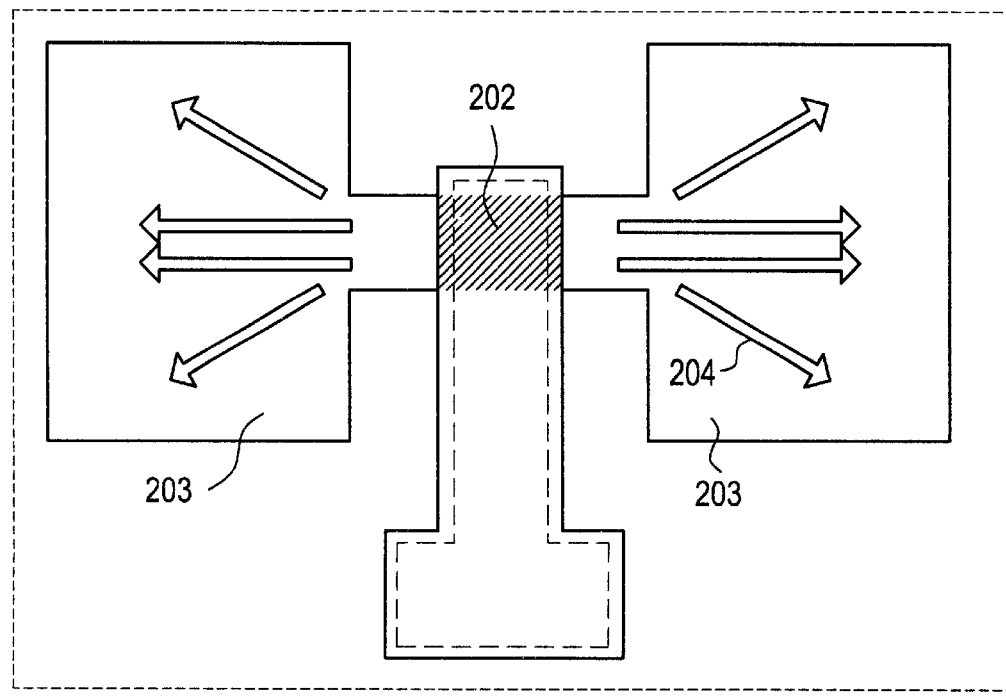
Figure 3:
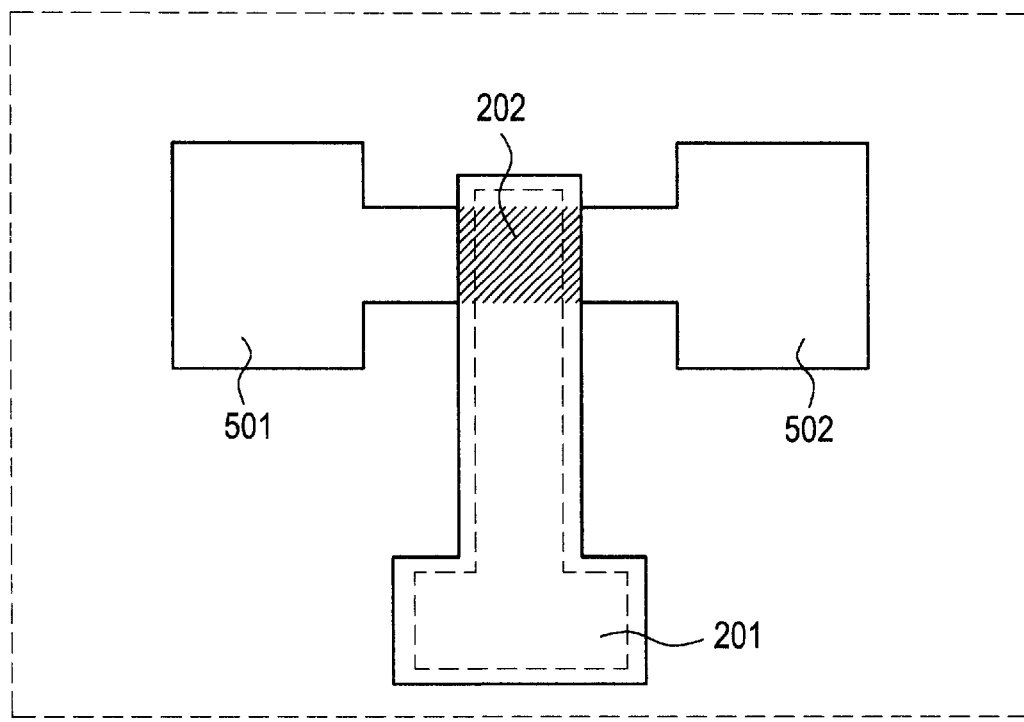
FIG. 3 is another planar view of a structure obtained in producing a TFT.
Figure 4A:
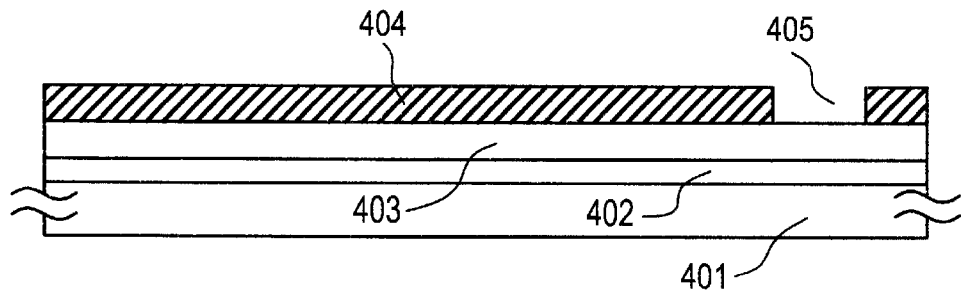
FIGS. 4A to 4D show the steps for producing a TFT.

In FIGS. 1A and 1B, FIGS. 2A and 2B, FIG. 3, FIGS. 4A to 4D, and FIGS. 5A to 5C, the method for producing a TFT according to the present example is described below. In FIG. 4A, a 3,000 Å thick silicon oxide film 402 is formed by sputtering as a base film on a glass substrate 401. An amorphous silicon film 403 is formed thereon at a thickness of 500 Å by plasma chemical vapor deposition (CVD) or low pressure thermal CVD.

An extremely thin oxide film (not shown) is formed on the surface of the amorphous silicon film 403 by ultraviolet (uv) oxidation. The UV oxidation method is a method for forming an oxide film by irradiating UV light to the amorphous silicon film in gaseous oxygen or an oxidizing atmosphere. The oxide film is formed in this stage to improve the wettability of the amorphous silicon film to the solution to be applied thereon in the later step.

A mask 404 is formed by using a resist. In the resist mask 404, a region 405 is exposed and has a rectangular shape, and in FIG. 4A, it is elongated from the front to the back of the paper plane.

The solution containing a metal element which accelerates the crystallization of silicon, i.e., nickel, is applied at this state. In the example, a nickel acetate solution is applied by spin coating. Thus, a state in which nickel is retained in contact with the surface of the amorphous silicon film 403 in the region 405 through an oxide film (not shown) is realized.

Then, heating treatment is performed at 550° C. for 4 hours after removing the resist mask. The heating treatment may be generally performed at 450 to 600° C. When a glass substrate is used as the substrate, the heating treatment is preferably performed at the deformation temperature or lower of the glass substrate to prevent shrinking or deformation from occurring on the substrate.

During the above heating treatment, crystal growth occurs in a direction of an arrow 102, i.e., in a direction in parallel with the substrate 401. The crystal growth is controllable, and it can be effected over a distance of from several tens of micrometers to several 100 $\mu$m, or longer.

Figure 1A:
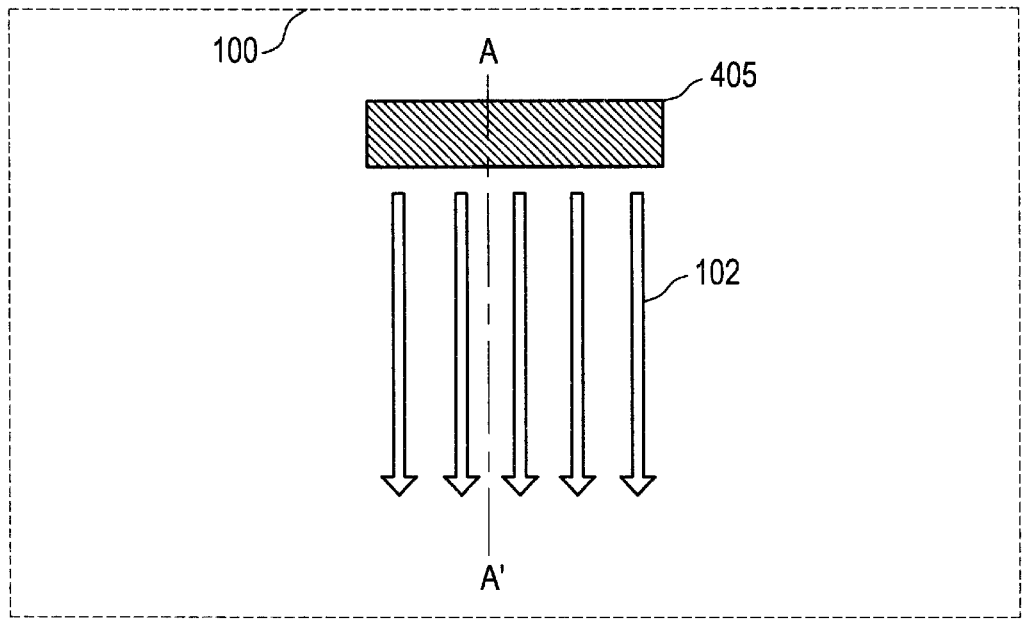
FIGS. 1A and 1B are planar views of a structure obtained in producing a thin film transistor (TFT)
Figure 4B:
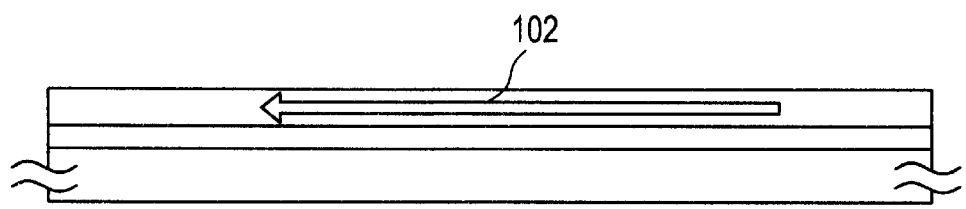

The planar view for the state of FIG. 4B is given in FIG. 1A. The cross sectional view taken along line A–A' in FIG. 1A is shown in FIG. 4B. In FIG. 1A, in the amorphous region 100 shown by broken lines, nickel element is retained in contact with the region 405. Thus, by heating treatment at 450° C. for 4 hours, a progressive crystal growth state occurs as is shown by 102.

Figure 1B:
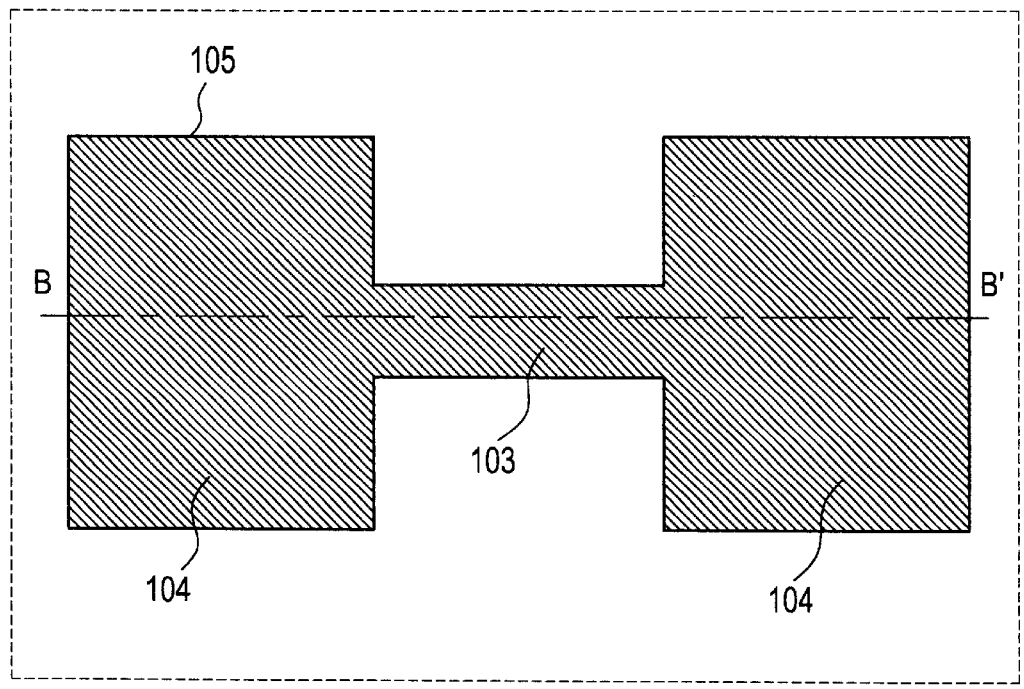

After the crystal growth, the crystalline silicon film is patterned into a pattern region 105 shown in FIG. 1B. The cross sectional view obtained along line B–B' in FIG. 1B is given in FIG. 4C. The pattern region 105 provides the active layer for the TFT. In FIG. 1B, the region 103 in the patterned region 105 corresponds to the portion in which crystal growth is performed in a direction parallel to the substrate 102. The region 104 is a region which remains in amorphous state. Preferably, the area of the amorphous region 104 is provided as large as possible. More nickel elements can be diffused in the later processes by providing the region 104 with a larger area.

Figure 4C:
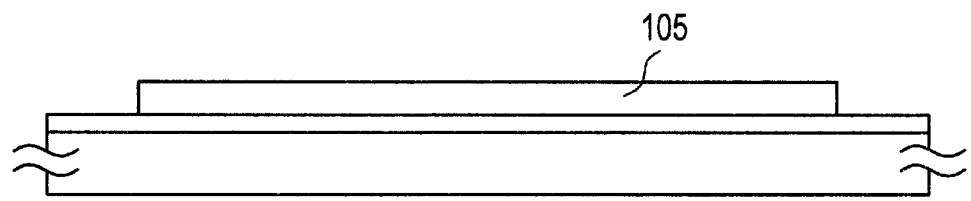
Figure 4D:
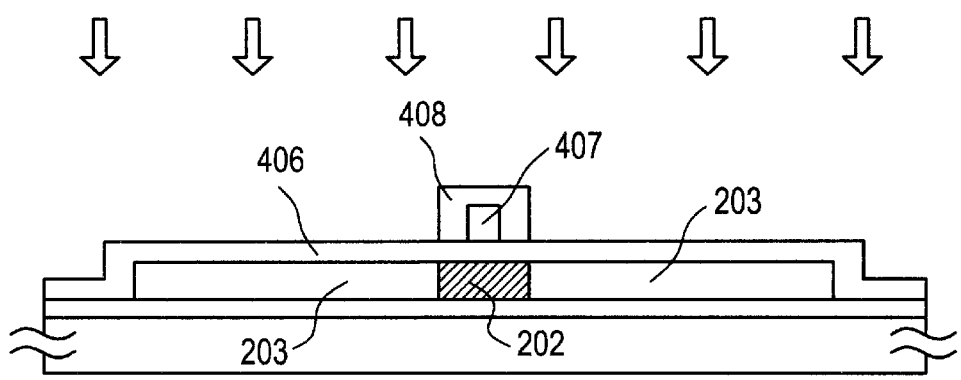

Then, in FIG. 4D, a silicon oxide film 406 which functions as a gate insulating film is formed by plasma CVD at a thickness of 1,000 Å. Then, a film containing aluminum as a main component thereof is formed at a thickness of 6,000 Å. The obtained aluminum-based film is patterned to form a gate electrode 407. The shape of the gate electrode 407 is shown in FIG. 2A. The cross sectional view along line A–A' in FIG. 2A is given in FIG. 4D.

After forming the gate electrode 407, an oxide layer 408 is formed on the periphery of the gate electrode 407 by anodic oxidation in an electrolytic solution using the gate electrode 407 as an anode. The oxide layer 408 has provided thickness of about 2,000 Å. The offset gate region to be formed in the later step of implanting impurity ions depends on the thickness of the oxide layer 408.

After obtaining a structure of FIG. 4D, ion impurities are implanted to form a source/drain region. Specifically, phosphorus ions are implanted in this example. In this step, impurity ions are implanted into the regions other than that in which the gate electrode 407 is formed. Further, the region into which impurity ions are implanted become amorphous by the impact of the impurity ions that collide against the region. Thus, as a result, only the region 202 shown in FIG. 2A remains crystalline, and the other regions 203 become amorphous. The region 202 and the region in the vicinity thereof contains nickel element used for accelerating the crystallization. The nickel concentration in the region of an arrow 102, in which the crystals are grown in parallel with the substrate 401, is found to be lower by about one digit as compared with the nickel concentration in the region 405 into which nickel is initially introduced.

Figure 5A:
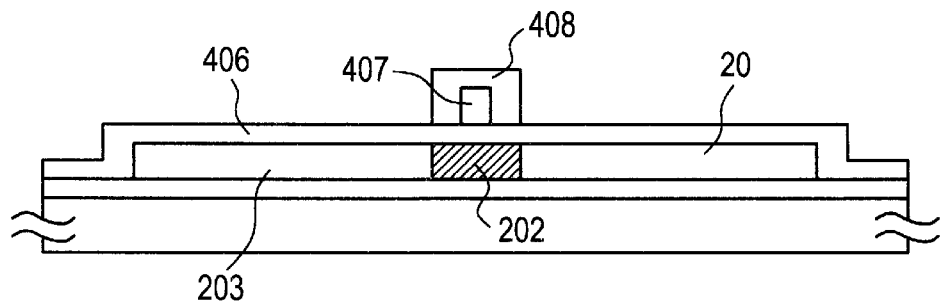
FIGS. 5A to 5C show another steps for producing a TFT.

The obtained structure is subjected to heating treatment at 400 to 450° C. as shown in FIG. 5A. In this case, the heating treatment is performed at 450° C. for 2 hours. By this treatment, the nickel atoms are observed to diffuse into the substantially amorphous region 203 from the region 202 as shown in the arrow 204. Since the region 203 has mainly amorphous portion, it contains defects in a large quantity, which function as nickel trap. Accordingly, during heating treatment, the substantially amorphous region 203 absorbs nickel from the crystalline region 202.

The above heating treatment cannot be performed at 450° C. or higher. If the heating treatment is effected at 450° C. or higher, the diffusion phenomenon of aluminum from the gate electrode 407 occurs in a distinguished manner.

The nickel concentration in the crystalline region 202 decreases to a half or lower upon the heating treatment. Then, the region 203 shown in FIG. 2B is patterned to form a patterned region shown in FIG. 3. In the example, the region 203 is patterned. However, the patterning may be omitted in case the region 203 is not particularly unnecessary. Thus, regions 501 and 502 as shown in FIG. 3 are formed. The regions 501 and 502 are provided as source/drain regions in the later step.

Figure 5B:
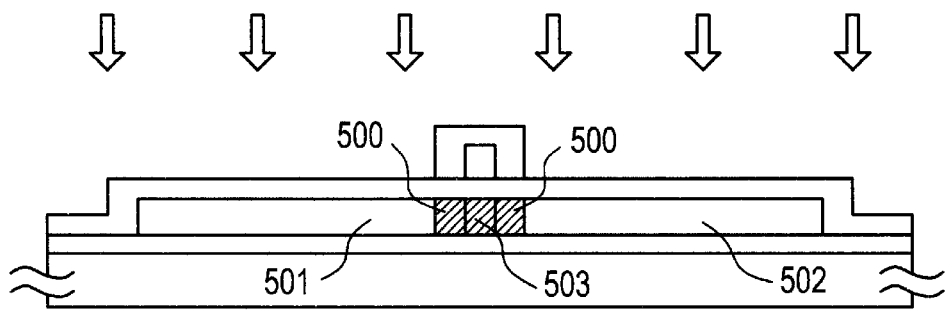

In FIG. 5B, laser light is irradiated to crystallize the regions 501 and 502 that are rendered amorphous by the implantation of impurity ions, and to activate the phosphorus element implanted into the these regions. A source region 501, a drain region 502, and a channel forming region 503 are formed in this step. An offset gate region 500 is formed at the same time.

Figure 5C:
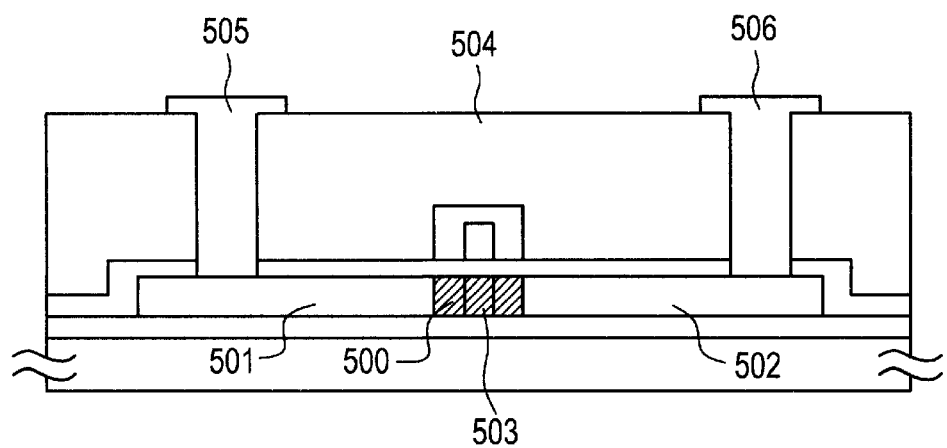

In FIG. 5C, a silicon oxide film 504 is formed to a thickness of 7000 Å, as an interlayer insulating film. After forming a contact hole, a source electrode 505 and a drain electrode 506 are formed. A TFT is finally obtained by heating treatment to the resulting structure at 350° C. for 1 hour in an atmosphere containing hydrogen (FIG. 5B).

Example 2

The present example is similar to Example 1, except for forming the gate electrode 407 with silicon or a silicide (a compound of a metal with silicon). In FIG. 5A, the heating treatment can be performed at the crystallization temperature of amorphous silicon or higher, i.e., 450° C. or higher. However, the heating treatment must be effected at a temperature not higher than the deformation temperature of the glass substrate, for instance, at 550° C. By the heating treatment, as shown in FIG. 2B, the region 203 once rendered amorphous is crystallized, and nickel element diffuses out from the crystalline region 202 along the progressive direction of crystal growth. Finally, nickel element is found to concentrate in the end portion of the region 203.

The later steps can be effected in a similar manner as those described in Example 1, to complete a TFT.

Example 3

The present example is an example of a method for performing heating treatment to allow the crystals grow from the region into which the metal element for accelerating the crystallization of silicon is introduced, and then producing a TFT using the obtained region. The producing method of the example differs from that described in Example 1 in two aspects; one is concerned with the relation between the region into which the metal element is introduced and the region to be crystallized, and the other is concerned with the morphology of the crystallized portion.

In the example, the region into which the metal element is introduced is crystallized, and then the active layer (channel forming region) of the TFT is produced by using the crystallized region.

Figure 6A:
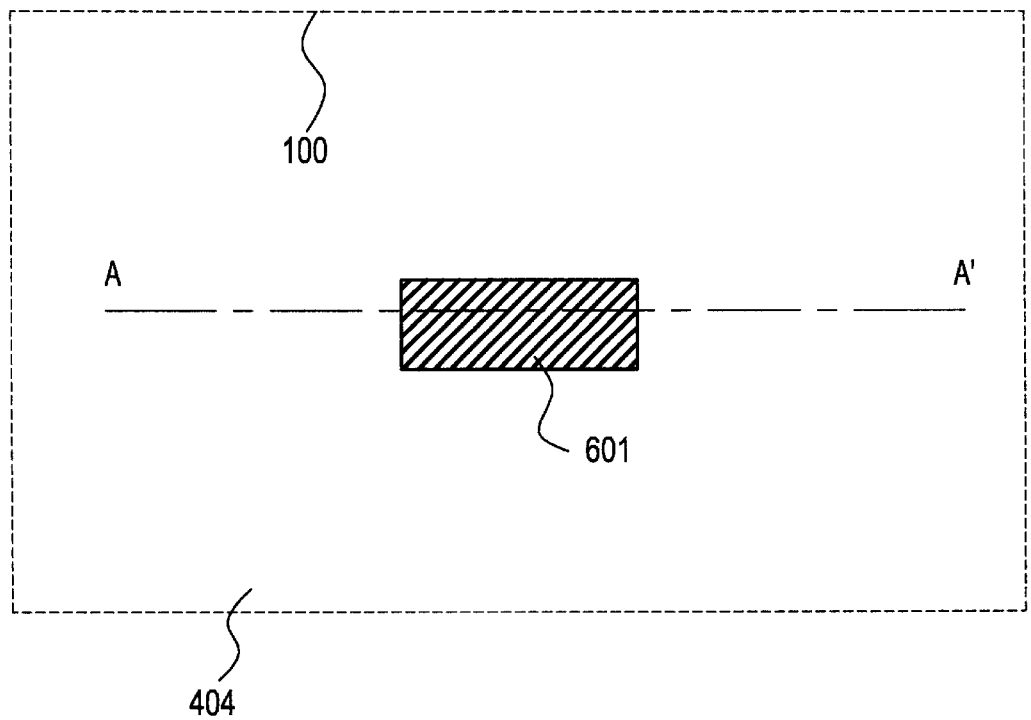
FIGS. 6A and 6B are planar views of a structure obtained in producing a TFT.
Figure 6B:
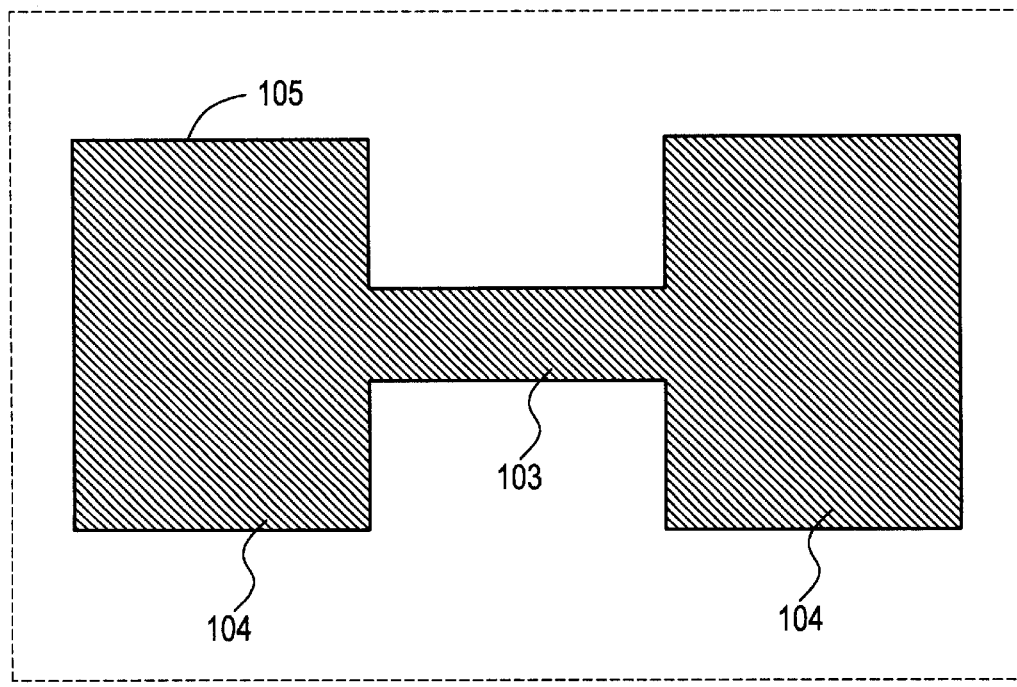

FIGS. 6A and 6B shows a part of the method for producing a TFT. In FIG. 6A, nickel element is introduced into a hatched region 601. Nickel element can be introduced in a manner similar to that employed in Example 1. However, it is necessary that the concentration of nickel in the nickel acetate solution is lowered by one digit or more as compared with that used in Example 1. If a nickel acetate solution having the same nickel concentration as that used in Example 1 is used, crystal growth occurs in the direction parallel to the substrate at crystallization by heating treatment.

In FIG. 6A, the region 601 can be crystallized by heating treatment at 550° C. for 4 hours. After crystallizing the region 601 in this manner, the region 601 is patterned to coincide with the region 103 in FIG. 6B.

In the example, the crystallized region into which nickel is introduced is provided in such a manner that it may become the channel forming region 103 of the active layer for the TFT. The subsequent steps are performed in the same manner as those described in Example 1.

Example 4

In the present example, nickel element is introduced not selectively, but over the entire surface of the amorphous silicon film. Thus, in the processes shown in FIG. 1A and in FIG. 4A, a nickel acetate solution may be applied to the whole surface of the amorphous silicon film 403 without forming any masks (as shown by 404 in FIG. 4A)

When the example is employed, nickel is provided at the same concentration in the entire pattern region 105 in FIG. 1B or FIG. 4C. Accordingly, a diffusion of nickel which occurs from the region containing nickel at a high concentration to that containing no nickel (more precisely, a region containing nickel at a concentration below the detection limit or at an extremely low concentration) cannot be expected in this case.

However, after implanting impurity ions for the formation of source/drain regions as shown in FIG. 2A, since the regions other than the region 202 which becomes the channel forming region are rendered amorphous, if heating treatment performed, nickel atoms move from the region 202 to the region 203 rendered amorphous. This is because the amorphous silicon film contain a larger number of defects and dangling bonds as compared with a crystalline silicon film (these defects and dangling bonds function as nickel trap) and therefore, by heating treatment, trapping of the nickel atoms by the defects and dangling bonds gradually occurs in the amorphous silicon film. That is, apparently, a phenomenon is observed that nickel atoms are removed or diffused from the region 203 rendered amorphous by ion implantation to the region 202 as shown in FIG. 2B. The heating treatment may be effected, for example, at 400 to 450° C. for 4 hours.

The subsecuent steps are performed in the same manner as those described in Example 1 to obtain a complete TFT.

According to the present invention, a TFT using a crystalline silicon film can be produced by a process at a heat resistant temperature of a glass substrate, more specifically, at 600° C. or lower, preferably, 550° C. or lower. Moreover, since the concentration of the metal element in the channel forming region can be lowered, a TFT with stable characteristics can be obtained.

The present invention is applicable not only to a TFT, but also to any device utilizing a thin film of crystalline silicon.

What is claimed is:

1. A semiconductor device comprising:
    an active layer having source and drain regions and a channel forming region over a substrate, the active layer including a material for promoting crystallization of the active layer; and
    a gate electrode formed adjacent to the channel forming region with a gate insulating film interposed therebetween,
        wherein crystallinity of said source and drain regions is lower than that of said channel forming region; and
        wherein an average concentration of the material in the channel forming region is equal to or smaller than that of the material in the source and drain regions.

2. The device of claim 1 wherein the material is at least one element selected from the group consisting of Fe, Co, Ni, Ru, Rh, Pd, Os, Ir, Pt, Cu, and Au.

3. The device of claim 1 wherein the channel forming region has the material at a concentration of $1\times10^{18}$ cm$^{-3}$ or lower, and each of the source and drain regions has the material at a concentration of $1\times10^{18}$ to $5\times10^{19}$ cm$^{-3}$.

4. A semiconductor device comprising:
    a substrate having an insulating surface;
    a semiconductor film comprising silicon having a crystalline region formed on the insulating surface, the crystalline region including a material for promoting crystallization of silicon; and
    a gate electrode formed adjacent to the semiconductor film with a gate insulating film interposed therebetween,
        wherein a concentration of the material in the crystalline region is equal to or smaller than that of the material in regions other than the crystalline region in the semiconductor film, and
        wherein said crystalline region includes a channel forming region of a thin film transistor, and said regions other than the crystalline region include source and drain regions of said thin film transistor.

5. The device of claim 4 wherein the material is at least one element selected from the group consisting of Fe, Co, Ni, Ru, Rh, Pd, Os, Ir, Pt, Cu, and Au.

6. The device of claim 5 wherein the crystalline region has the material at a concentration of $1\times10^{18}$ cm$^{-3}$ or lower, and the regions have the material at a concentration of $1\times10^{18}$ to $5\times10^{19}$ cm$^{-3}$.

7. The device of claim 1 wherein the source and drain regions include phosphorus.

8. The device of claim 1 wherein the source and drain regions include traps of the material.

9. The device of claim 1 wherein the material is included in the channel forming region at a concentration of $1\times10^{16}$ cm$^{-3}$ or lower.

10. The device of claim 4 wherein the regions include phosphorus.

11. The device of claim 4 wherein the regions include traps of the material.

12. The device of claim 4 wherein the material is included in the crystalline region at a concentration of $1\times10^{16}$ cm$^{-3}$ or lower.

13. A semiconductor device comprising:
    an active layer comprising a semiconductor film comprising silicon formed on an insulating surface, the active layer having a channel forming region and source and drain regions and including a material for promoting crystallization of silicon, wherein said channel forming region comprises crystalline silicon and said source and drain regions comprise amorphous silicon, wherein a concentration of the material included in the channel forming region is lower than that of the material in the source and drain region, and wherein the concentration of the material included in the channel forming region is $1\times10^{16}$ cm$^{-3}$ or lower.

14. The device of claim 13 wherein the material is selected from the group consisting of Fe, Co, Ni, Ru, Rh, Pd, Os, Ir, Pt, Cu, and Au.

15. The device of claim 13 wherein the source and drain regions include phosphorus.

16. The device of claim 13 wherein the source and drain regions has the material at a concentration of $1\times10^{18}$ to $5\times10^{19}$ cm$^{-3}$.

17. A semiconductor device comprising:

a semiconductor film comprising silicon formed over an insulating surface, the semiconductor film having a crystalline region and amorphous regions, wherein said crystalline region has a channel forming region of a thin film transistor and said amorphous regions have source and drain regions of said thin film transistor, respectively, wherein amorphous regions include phosphorus, and wherein the semiconductor film includes a material for promoting crystallization of silicon and a concentration of the material included in the crystalline region is lower than that in amorphous regions.

18. The device of claim 17 wherein the material is selected from the group consisting of Fe, Co, Ni, Ru, Rh, Pd, Os, Ir, Pt, Cu, and Au.

19. The device of claim 17 wherein the a concentration of the material in the crystalline region is at a concentration of $1\times10^{16}$ cm$^{-3}$ or lower.

20. The device of claim 17 wherein the crystalline region has the material at a concentration of $1\times10^{18}$ cm$^{-3}$ or lower, and the amorphous regions have the material at a concentration of $1\times10^{18}$ to $5\times10^{19}$ cm$^{-3}$.

21. A semiconductor device comprising:

an active layer comprising a semiconductor film comprising silicon formed on an insulating surface, the active layer having a channel forming region and source and drain regions and including a material for promoting crystallization of silicon, wherein crystallinity of said source and drain regions is lower than that of said channel forming region;

wherein the source and drain regions have traps of the material for removing the material from the channel forming region, and wherein a concentration of the material included in the channel forming region is lower than that of the material in the source and drain region.

22. The device of claim 21 wherein the concentration of the material included in the channel forming region is $1\times10^{16}$ cm$^{-3}$ or lower.

23. The device of claim 21 wherein the source and drain regions have the material at a concentration of $1\times10^{18}$ to $5\times10^{19}$ cm$^{-3}$.

24. The device of claim 21 wherein the material is selected from the group consisting of Fe, Co, Ni, Ru, Rh, Pd, Os, Ir, Pt, Cu, and Au.

25. The device of claim 21 wherein the source and drain regions include phosphorus.

26. The device of claim 21 wherein the channel forming region comprises a crystalline region of the semiconductor film and said source and drain regions comprise amorphous regions of the semiconductor film.

27. The device of claim 21 wherein the defects and dangling bonds in the source and drain regions are larger than that in the channel forming region.

28. A semiconductor device comprising:

a semiconductor film comprising silicon formed over an insulating surface, the semiconductor film having a crystalline region and amorphous regions and including a material for promoting crystallization of silicon, wherein said crystalline region includes a channel forming region of a thin film transistor, and said amorphous regions include source and drain regions of said thin film transistor, wherein the amorphous regions have portions for absorbing the material included in the crystalline region, and wherein a concentration of the material included in the crystalline region is lower than that in the amorphous regions.

29. The device of claim 28 wherein the material is selected from the group consisting of Fe, Co, Ni, Ru, Rh, Pd, Os, Ir, Pt, Cu, and Au.

30. The device of claim 28 wherein the concentration of the material in the crystalline region is at a concentration of $1\times10^{16}$ cm$^{-3}$ or lower.

31. The device of claim 28 wherein the crystalline region has the material at a concentration of $1\times10^{18}$ cm$^{-3}$ or lower, and the amorphous regions have the material at a concentration of $1\times10^{18}$ to $5\times10^{19}$ cm$^{-3}$.

32. The device of claim 28 wherein the region other than the crystalline region is included in source and drain regions of the semiconductor device.

33. The device of claim 28 wherein the region other than the crystalline region comprises amorphous silicon.

34. The device of claim 28 wherein the region other than the crystalline region includes phosphorus.

35. A device according to claim 1 wherein said source and drain regions comprise amorphous regions and said channel forming region comprises a crystalline region.

* * * * *